United States Patent [19]

Kay et al.

[11] Patent Number: 4,655,848
[45] Date of Patent: Apr. 7, 1987

[54] HGCDTE EPITAXIALLY GROWN ON CRYSTALLINE SUPPORT

[75] Inventors: Robert E. Kay, Newport Beach; Hakchill Chan, Corona del Mar; Fred Ju, Huntington Beach; Burton A. Bray, Laguna Niguel, all of Calif.

[73] Assignee: Ford Aerospace & Communications Corporation, Detroit, Mich.

[21] Appl. No.: 769,816

[22] Filed: Aug. 26, 1985

[51] Int. Cl.$^4$ .................. H01L 21/38; H01L 21/36
[52] U.S. Cl. ............................. 148/1.5; 29/576 E; 148/174; 148/175; 148/186; 427/76; 428/620
[58] Field of Search ............. 148/1.5, 174, 175, 186; 427/76; 428/620; 29/576 E

[56] References Cited

U.S. PATENT DOCUMENTS

| | | | |
|---|---|---|---|
| 3,622,405 | 11/1971 | Schmit | 148/13 |
| 4,418,096 | 11/1983 | Gauthier et al. | 427/76 |
| 4,447,470 | 5/1984 | Kay | 427/76 |
| 4,487,640 | 12/1984 | Erstfeld | 148/175 |
| 4,487,813 | 12/1984 | Kay | 148/174 X |
| 4,588,446 | 5/1986 | Tegilgas | 148/1.5 |

OTHER PUBLICATIONS

Marfaing et al., Crystal Growth, "A New Process of Crystal Growth: Evaporation–Diffusion Under Isothermal Conditions", Pergamon Press, N.Y., Jun. 20–24, 1966, pp. 549–552.
Tufte et al., "Growth and Properties of $Hg_{1-x}Cd_xTe$ Epitaxial Layers", J. Applied Phys., vol. 40, No. 11, pp. 4559–4568, (Oct. 1969).
Vohl et al., J. Electronic Materials, vol. 7, No. 5, pp. 659–678, (1978), "Vapor Phase Growth of $Hg_{1-x}Cd_xTe$ Epitaxial Layers".

Primary Examiner—George T. Ozaki
Attorney, Agent, or Firm—Edward J. Radlo; Clifford L. Sadler

[57] ABSTRACT

A layer of HgCdTe (15) epitaxially grown onto a crystalline support (10), e.g., of sapphire of GaAs. A CdTe substrate (5) is epitaxially grown to a thickness of between 1 micron and 5 microns on the support (10). A HgTe source (3) is spaced from the CdTe substrate (5) a distance of between 0.1 mm and 10 mm. The substrate (5) and source (3) are heated together in a thermally insulating, reusable ampoule (17) within a growth temperature range of between 500° C. and 625° C. for a growth step having a duration of between 5 minutes and 4 hours. Then an interdiffusion step is performed, in which the source (3) and substrate (5) are cooled within a temperature range of between 400° C. and 500° C. for a time of between 1 hour and 16 hours. In a first growth step embodiment, the source (3) and substrate (5) are isothermal. In a second growth step embodiment, the source (3) and substrate (5) are non-isothermal. Means are disclosed for preventing contamination of the reactants during HgTe (3) synthesis, and for polishing the HgCdTe layer (15).

6 Claims, 2 Drawing Figures

HGCDTE EPITAXIALLY GROWN ON CRYSTALLINE SUPPORT

DESCRIPTION

1. Technical Field

This invention pertains to the field of epitaxially growing HgCdTe (mercury cadmium telluride), useful in infrared detectors and the like, on crystalline supports.

2. Background Art

U.S. Pat. Nos. 4,447,470 and 4,487,813 disclose methods for epitaxially growing HgCdTe upon CdTe substrates. The method described in these two patents differs from that of the present invention in that crystalline supports are not used, there is no cool-down interdiffusion step, and the thickness of the CdTe substrate is typically 1 mm, as compared with the 1 to 5 microns in the present invention. The compositional profile of the finished HgCdTe is desirably much sharper when the present invention is used, compared with these prior art patents. This is graphically indicated in FIG. 2. In the prior art patents, the mole fraction (x) of cadmium in the epitaxially grown HgCdTe which is a distance of at least 20% of the HgCdTe layer thickness away from the CdTe substrate varies by no more than 10% as a function of said distance. The compositional profile of the present invention is sharper, in that the mole fraction (x) of cadmium in the epitaxially grown HgCdTe 15 which is a distance of at least 1% of the HgCdTe layer 15 thickness away from the CdTe substrate 5 varies by no more than 10% as a function of said distance. Thus, there is no or practically no CdTe left at all. This is highly desirable, because it sharpens the cut-off of the finished HgCdTe infrared detector as a function of wavelength, and increases the RA (resistance times area) product.

U.S. patent application Ser. No. 769,909 filed the same day as the instant patent application, entitled "Non Isothermal Method for Epitaxially Growing HgCdTe" and having the same inventors and assignee as the present application, discloses a non isothermal method for epitaxially growing HgCdTe upon CdTe substrates, which method differs from that of the present invention in that: crystalline supports are not always used; there is no cool-down interdiffusion step; and there is no restriction on the thickness of the CdTe substrate. As a result of these differences, the compositional profile of the finished HgCdTe is desirably sharper when the present invention is used.

U.S. Pat. No. 4,487,640 discloses a method for epitaxially growing HgCdTe onto CdTe substrates, which method differs from that of the present invention in that: (1) It uses two different sources (16 and 20) maintained at different temperatures, whereas the present invention uses one source. (2) It is not a closely-spaced process, whereas the present invention is. As used herein, "closely-spaced" means the HgTe source and CdTe substrate are spaced apart between 0.1 mm and 10 mm. (3) It uses a carrier gas ($H_2$+HX), whereas the present invention does not. (4) The source zones ($T_2$ and $T_3$) are hotter than the substrate zone ($T_1$). (5) It does not vary the temperatures over the course of the growth phase, whereas the present invention sometimes does.

Tufte et al., "Growth and Properties of $Hg_{1-x}Cd_xTe$ Epitaxial Layers", *J. Applied Phys.*, Vol. 40, No. 11, pp. 4559–4568 (October 1969), describes methods for growing HgCdTe onto CdTe substrates that do not produce as sharp compositional profiles as in the present invention.

U.S. Pat. No. 4,418,096 discloses a method for epitaxially growing HgCdTe onto a CdTe substrate, which method differs from that of the present invention in that: (1) It uses dangerous mercury overpressures of between 4 and 50 atmospheres, col. 4, lines 34–36; the present invention does not use mercury overpressure. (2) The finished layers are at least 158 microns thick, whereas the layers 15 of the present invention are no more than 30 microns thick. (3) The processing time is at least 8 days, whereas that of the present invention is no more than 20 hours. (4) The compositional profile is not nearly as good. (5) The source and substrate are always at the same temperature with respect to each other; this is not always true in the present invention.

U.S. Pat. No. 3,622,405 relates to the growth of bulk HgCdTe crystals, not epitaxial layers of same, that are annealed by raising them to temperatures in the vicinity of 755° C.

Vohl et al., *J. Electronic Materials*, Vol. 7, No. 5, pp. 659–678 (1978), discloses a "hot wall" process for making HgCdTe, rather than a closely-spaced process, in which the starting ingredients are elemental Hg, Cd, and Te.

DISCLOSURE OF INVENTION

In this method for epitaxially growing a layer of HgCdTe (15) onto a crystalline support (10), a CdTe substrate (3) is epitaxially grown to a thickness of between 1 micron and 5 microns onto the support (10), which is fabricated of, e.g., sapphire or GaAs. A HgTe source (3) is spaced from the CdTe substrate (5) a distance of between 0.1 millimeter and 10 millimeters. Particularly good results have been achieved with 2 mm spacing. The substrate (5) and source (3) are heated within a growth temperature range of between 500° C. and 625° C. for a growth step having a duration of between 5 minutes and 4 hours. The HgTe (3) and CdTe (5) are then cooled within an interdiffusion temperature range of between 400° C. and 500° C. for an interdiffusion step having a duration of between 1 hour and 16 hours. Preferably, the substrate (5) is at the same constant temperature as the source (3) during the interdiffusion step.

The source (3) is $Hg_yTe$ where y is between 0.8 and 1.05 inclusively. The source (3) and substrate (5) are heated together in a thermally insulating reusable ampoule (17). The epitaxially grown HgCdTe layer (15) has a thickness of between 0.7 microns and 30 microns. It can then be polished, to etch off any unwanted Hg-rich skin on its surface.

During the growth step, changing the crystal plane or the axial orientation of the CdTe substrate (5) does not affect the rate of growth of the HgCdTe layer (15), the single crystal nature of the HgCdTe (15), or its mirror-like finish. All other things being equal, the lower the mole fraction of mercury in the HgTe source (3), the greater the mole fraction of mercury in the grown HgCdTe layer (15), and vice-versa.

In a first embodiment for the growth step, the temperature is substantially constant and substantially the same for both the source (3) and the substrate (5). This embodiment follows many of the teachings of prior art U.S. Pat. Nos. 4,447,470 and 4,487,813.

In a second embodiment for the growth step, the substrate (5) is hotter than the source (3) for at least 5 minutes. This embodiment follows the teachings of U.S. patent application Ser. No. 769,909 filed the same day as the instant patent application, and entitled "Non Isothermal Method for Epitaxially Growing HgCdTe".

BRIEF DESCRIPTION OF THE DRAWINGS

These and other more detailed and specific objects and features of the present invention are more fully disclosed in the following specification, reference being had to the accompanying drawings, in which.

BEST MODE FOR CARRYING OUT THE INVENTION

Perhaps the most troublesome feature of existing VPE methods is the use of quartz tubes, pistons and rings as materials for growth ampoules. New quartz is required for each run because the ampoule is destroyed when it is opened. This increases material and preparation costs, makes conversion to a production method difficult, and, most importantly, compounds the problem of contamination coming from the ampoule. Analyses indicate that impurities in the quartz or from the reagents used to "clean" it are the major sources of impurity dopants found in HgCdTe layers formed by CSVPE. The sealing process, which consists of fusing the piston to the ampoule by melting it with an $H_2$—$O_2$ flame, may also contribute to this problem, since such high temperatures may release impurities from the quartz which otherwise would remain trapped.

Thus, a reusable ampoule is very desirable, not only because it reduces material costs, but most importantly because with reusable ampoules a large improvement in the consistency of producing device quality HgCdTe 15 is enjoyed. This is so because when containers are repeatedly reused, they undergo self-purification, due primarily to the formation of a pure product coating on their surfaces, and secondarily, to an early leach-out of loosely held contaminants (especially in gas phase reactors).

Figure 1:
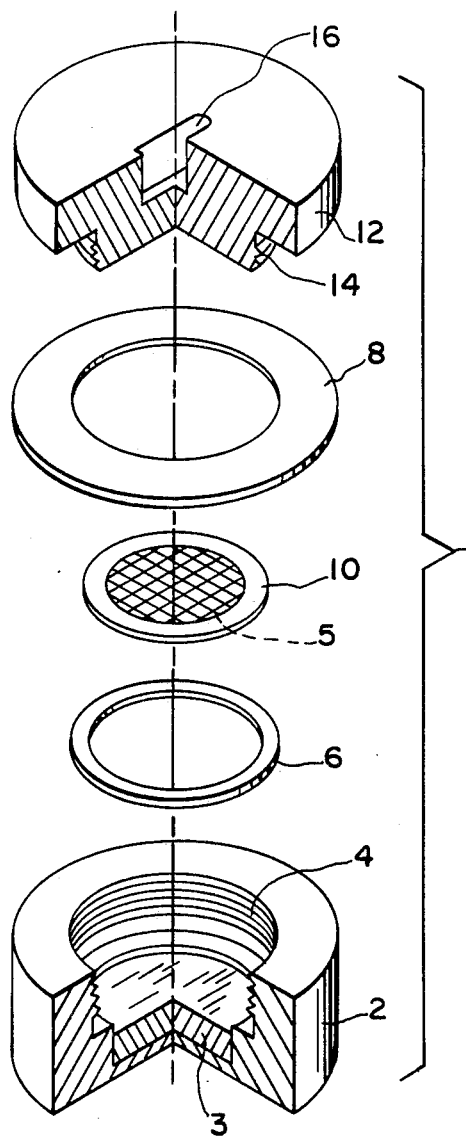
FIG. 1 is an exploded isometric view of a reusable growth apparatus 17 suitable for growing a HgCdTe layer 15 according to the teachings of the present invention.
Figure 2:
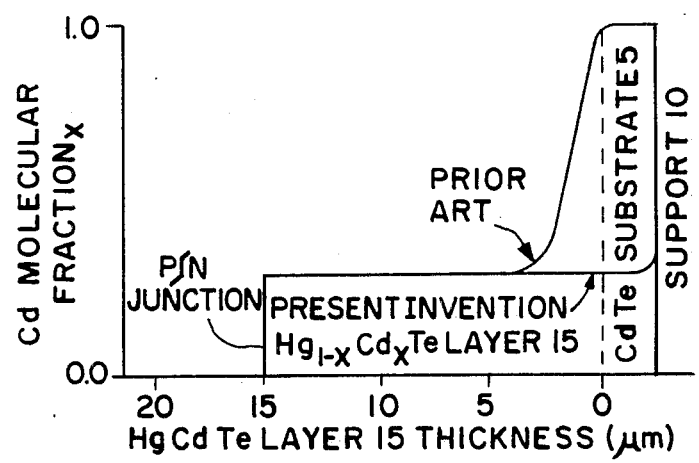
FIG. 2 is a compositional profile of a HgCdTe layer 15 fabricated according to the teachings of the present invention, compared with that for a layer made following the teachings of prior art U.S. Pat. Nos. 4,447,470 and 4,487,813.

We have developed a reusable thermally insulating growth fixture 17, as illustrated in FIG. 1. This ampoule can be baked out at 960° C. under $10^{-6}$ torr to free it of surface contaminants. Fixture 17 is made from a thermal insulator, such as machinable polycrystalline $Al_2O_3$ or boron nitrite-silicon nitrite composite, to facilitate the maintenance of source 3 and substrate 5 at different temperatures in those embodiments involving non-isothermal processing, e.g., by separate annular thermocouplers surrounding fixture 17.

Fixture 17 comprises a simple screw-cap lid 12 fitting into a receptacle 2 and sealed by a low-cost gasket 8 made, e.g., of graphoil. Fixture 17 can be used almost indefinitely and need be recharged with a HgTe source 3 only occasionally. Receptacle 2 is fitted with spacers-/adapters 6 whose central openings allow growth on a variety of shapes and sizes of substrates 5. In a fixture 17 that has been built, substrate 5 can be up to two inches in diameter. HgTe source 3, which can be a loose powder, a pressed powder, or a slice from an ingot, can accommodate various sized substrates 5, and is left in receptacle 2 for repeated use.

The growth preparation sequence is simple, but requires that assembly take place in an inert atmosphere (e.g., argon). To use the apparatus 17, the appropriate adapter 6 is placed in receptacle 2, substrate 5 is added, gasket 8 is set in place, and lid 12 is screwed on by means of inserting a screwdriver into slot 16 and twisting. Substrate 5 is grown on the underside of support 10, which is transparent to IR. Threads 14 of lid 12 engage corresponding threads 4 of receptacle 2. No evacuation of the ampoule 17 is required, since the argon does not adversely affect the growth process. The sealed ampoule 17 is then placed in a furnace for the growth and interdiffusion steps.

The inner volume of growth fixture 17 must be kept relatively small (less than 10 cc for typically-sized layers 15) to maintain the Hg pressure within an effective range. A typical growth apparatus 17 used successfully has a free volume of 2 cm$^3$; consequently, only $8.8 \times 10^{-11}$ moles of CdTe 5 need evaporate into the fixture 17 to saturate the volume at 570° C. This corresponds to an insignificant loss of 5.7 picometers in CdTe 5 thickness.

The HgTe source 3 provides Hg not only by dissociation, but also from interstitial Hg. Since the interstitial Hg concentration is very high, this added Hg pressure is significant and is given by:

$$P_{Hg}(\text{atm}) = \tfrac{1}{2}(4vN_oK_1/VRT)^{\tfrac{1}{2}}$$

where
v = volume of HgTe source 3
V = inner volume of growth ampoule 17
$N_o = 6.03 \times 10^{23}$
$K_1 = 2.5 \times 10^{20}$
T = growth temperature (°C.)
R = gas constant The above equation shows that one must control both growth ampoule 17 volume and HgTe 3 volume if reproducible Hg pressures are to be obtained. The volume of the HgTe source 3 is fixed within a narrow range; however, volumes of the prior art quartz ampoules can vary significantly, since it is difficult to reproduce the seal and because the dimensions of quartz tubing are subject to considerable variation. On the other hand, with the machined growth fixture 17 shown in FIG. 1, this volume is desirably always the same.

The CdTe substrate 5 is prepared by epitaxially growing it to a thickness of between 1 micron and 5 microns on a support 10, which is preferably infrared-transparent so layer 15 can be back-illuminated. For example, a film of CdTe is deposited on sapphire support 10 by an ion-pumped ultrahigh vacuum MBE system having a base pressure of less than $1 \times 10^{-8}$ torr. A single Radak II oven (manufactured by Luxel Corp.) can be used, fitted with a Coors AD998 $Al_2O_3$ crucible, and used as an MBE vapor source. The crucible contains 30 g of CdTe in the form of approximately 1 cc cubes cut from an ultrahigh purity, undoped, high resistivity ($10^8$ ohm-cm) ingot. The sapphire supports 10 are mounted on a Mo heater block and held in place with a Mo mask defining the deposition geometry. The sapphire 10 is preannealed at about 925° C. CdTe films 5 varying in thickness from 1 to 5 microns are grown at deposition rates from 1.5 to 7.5 angstroms/sec, and at support 10 temperatures from 260° C. to 350° C.

Alternatively, CdTe films 5 can be deposited in a Perkin-Elmer ULTEK Rapid Cycle Vacuum System utilizing a mechanical blower to reach 100 torr, a dual stage sorption pump to reach $10^{-2}$ torr, and an 8 part differential ion pump to reach the ultimate base pressure in the low $10^{-9}$ torr region. A titanium sublimator and liquid nitrogen jacket are used to increase pumping speed. An 18 inch glass bell jar houses the deposition chamber. Sapphire supports 10 are mounted in a molybdenum heater assembly which heats the supports 10 to an annealing temperature of 925° C. A Radak II heater with a one inch aperture sublimes the CdTe onto support 10. A UTI mass spectrometer is used to monitor the partial pressures of the residual gases during deposition.

Sapphire epitaxial grade supports 10, supplied by Union Carbide, are prepared for deposition in Class 100 hoods in a Class 1000 clean room. The supports 10 are degreased with a hot solvent spray, HF and HCl acid, and an $NH_3OH$ rinse to further remove organics and other particulates on their surfaces. Once chemically cleaned, the supports 10 are mounted in the heater assembly and the chamber is then pumped down to $10^{-8}$ torr. The supports 10 are then subjected to a 925° C. anneal for 20 minutes. Before growth, the CdTe is outgassed at 600° C. for 5 minutes. The CdTe is then allowed to cool to 550° C. while the support 10 is cooled to about 290° C. The shutter in the bell jar is then opened to begin the deposition. Typical growth rates are about two microns per hour.

The composition of the HgTe source 3 affects the $Hg_{1-x}Cd_xTe$ layer 15 composition in regard to both x-value and impurity content. It is therefore desirable to have a methodology for forming HgTe 3 which produces a consistent wafer composition and minimizes the introduction of contaminants. The usual methodology for compounding HgTe produces ingots which are not uniform in composition and are subject to contamination from impurities leached from their quartz containers at the high reaction temperature (670° C.). In addition, the operation is hazardous because high Hg pressures (often greater than 10 atms) are produced when the reactants are heated. The product often breaks the ampoule when it cools because it sticks to the wall and has a much higher coefficient of thermal expansion than the quartz.

To overcome these problems, a new methodology for compounding $Hg_yTe$ 3 (where y is between 0.8 and 1.05, inclusively) has been developed. In our procedure, all operations are carried out in an atmosphere control station filled with argon having a $H_2O$ and $O_2$ content of less than 10 ppm. To make the $Hg_yTe$, appropriate quantities of Hg and Te are ground together in a diamonite mortar. Since there is no oxygen to form a protective oxide coating on the Te, the Te and Hg react at room temperature during the grinding operation to produce a black powder of $Hg_yTe$. This powder is placed in receptacle 2 of growth apparatus 17, and pressed into a pellet for use as source 3. This procedure eliminates both the hazard associated with compounding HgTe and the contamination due to impurities leaching from hot quartz into source 3.

As an example of the non-isothermal growth step embodiment, a performed procedure for growing 4.5 micron $\lambda_{co}^{300}$ HgCdTe 15 on a CdTe substrate 5 that has been epitaxially grown on a sapphire support 10 will now be described. All operations are carried out in an atmosphere control station until after the growth apparatus 17 is sealed.

A one inch diameter CdTe substrate 5 epitaxially grown on a sapphire support 10 is prepared by the procedure described previously, and transferred to the atmosphere control station. A $Hg_{0.9}Te$ source 3 is prepared by grinding together 5.0 g of Te and 7.7 g of Hg. This amalgam is placed in receptacle 2 of reusable growth apparatus 17. The growth apparatus 17 is assembled and sealed by the method described previously, then removed from the atmosphere control station and placed in a microprocessor controlled two-zone furnace.

The growth step has a duration of 110 minutes. Source 3 and substrate 5 start at ambient room temperature. The temperatures of substrate 5 and source 3 are ramped to about 559° C. and 555° C., respectively, over a period of 20 minutes. During the growth step, the source 3 temperature never exceeds the substrate 5 temperature; this is important, since it prevents spurious droplets of HgTe and/or Te from forming on substrate 5. The layer 15 is allowed to grow for about 40 minutes (from t=20 minutes to t=60 minutes) at constant substrate 5 and source 3 temperatures. The source 3 temperature (but not the substrate 5 temperature) is then abruptly lowered (to about 550° C.) and growth continued for another 45 minutes, during which time the compositional profile of layer 15 is sharpened. From t=105 minutes to t=110 minutes, source 3 and substrate 5 are cooled down in transition to the interdiffusion temperature range of 400° C. to 500° C.; during this transition period, the temperature is above 500° C. and HgCdTe 15 continues to grow, invariably Hg-rich and n-type, as contrasted with p-type HgCdTe just below the surface. Depending upon the rate of cool-down, the thickness of this n-type skin varies from a few hundred Angstroms to 2–3 microns.

Unless it is desired to use this naturally formed p-n heterojunction, e.g., for fabrication of mesa diodes, the surface is etched to remove the Hg-rich skin. This is done by a new polishing method we have developed, which overcomes the difficulties inherent in the conventional polishing method known as hydroplaning. Our method is extremely simple, and produces surfaces which are nearly equal in smoothness to hydroplaned samples. The methodology requires only a silicone rubber pad, a chemical etchant, and a lucite wafer holder. The support 10 is affixed to the lucite holder with a drop of glycerol, and the HgCdTe layer 15 is polished on the silicone rubber pad, which has been wet with a solution of 0.5% Br in equal parts of methanol and glycerol. Layer 15 is made to move over the rubber pad in a figure eight pattern. The silicone rubber pad removes surface coatings from layer 15, much like a windshield wiper, and allows a steady uniform chemical etch of the surface. Because of its softness, the silicone rubber has no abrasive effect on layer 15. 300 figure eights remove about 3 microns of HgCdTe 15. The result is an exceedingly smooth, mirror-like layer 15 having a thickness of about 14 microns and a $\lambda_{co}^{300}$ of about 4.5 microns.

As an alternative to this growth step embodiment, the substrate 5 and source 3 are heated together at a constant growth temperature of between 500° C. and 625° C. for a fixed growth time of between 5 minutes and 4 hours. The procedures outlined in U.S. Pat. Nos. 4,447,470 and 4,487,813 are followed, except that the growth temperature can be as low as 500° C., rather than 520° C.; and the growth time can be as little as 5 minutes rather than 15 minutes.

After the growth step has been performed, the interdiffusion step is performed. During this step, Hg diffuses from the HgCdTe into the Cd, and Cd diffuses from the CdTe into the HgCdTe. The substrate 5 and source 3 are cooled within an interdiffusion temperature range of between 400° C. and 500° C. for an interdiffusion time of between 1 hour and 16 hours. During the interdiffusion step, the substrate 5 and source 3 are typically but not necessarily maintained at the same substantially constant temperature. After the interdiffusion step, little, if any, CdTe remains. For all intents and purposes, the HgCdTe layer 15 is epitaxially grown on support 10. This offers the advantage of greater strength than growth on bulk CdTe, enabling the construction of larger layers 15; and offers all the advantages of ultra-sharp non-graded compositional profiles.

Even HgCdTe layers 15 having perfect crystallinity and optical properties are of little use for electro-optic device fabrication if their electrical properties are rendered unfit by contamination with electro-active species. Therefore, contamination control is of great importance in the production of epitaxial HgCdTe layers 15 for electro-optic devices.

Contaminants arise from the following sources: (a) the ambient environment; (b) the reactants HgTe and CdTe; and (c) the growth apparatus.

Contaminants from the ambient environment consist of particulates encountered on work surfaces and in the ambient atmosphere, and gases and vapors (including oxygen and water) present in the atmosphere. To lessen contamination from these sources, all of the apparatus assembly and material preparation should be performed in an atmosphere control station. A typical atmosphere control station contains a high purity argon atmosphere that is continually cycled through a purifier to remove oxygen, water vapor, particulates, and many chemical species. This system provides a work area which has an average oxygen and water content of less than 10 ppm and is essentially particle free.

Contaminants which arise from the HgTe source 3 and the CdTe substrate 5 are due to substances inherent in the materials, or deposited on or in the materials during preparation or synthesis. We purchase six 9's Te and seven 9's Hg packed in argon for the synthesis of the HgTe 3. Consequently, we do not control the contaminants inherent to these materials initially. We have concentrated our efforts on preventing contamination of the reactants during HgTe 3 synthesis. To prevent contamination of HgTe 3 during synthesis, the HgTe 3 is compounded in the atmosphere control station.

Combinations of CdTe substrates 5 epitaxially grown on sapphire or GaAs supports 10 do not require polishing; they are transported in plastic boxes from the preparation chamber to the atmosphere control station.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for epitaxially growing a layer of HgCdTe onto a crystalline support, comprising the steps of:

epitaxially growing a CdTe substrate to a thickness of between 1 micron and 5 microns onto the support;

spacing a HgTe source between 0.1 mm and 10 mm apart from the CdTe;

performing a growth step in which the HgTe and CdTe are heated within a growth temperature range of between 500° C. and 625° C. for a growth time of between 5 minutes and 4 hours; and performing an interdiffusion step in which the HgTe and CdTe are cooled within an interdiffusion temperature range of between 400° C. and 500° C. for an interdiffusion time of between 1 hour and 16 hours.

2. The method of claim 1 wherein the spacing between the HgTe source and the CdTe substrate is approximately 2 mm.

3. The method of claim 1 wherein the support is fabricated of a material from the class of materials comprising sapphire and GaAs.

4. The method of claim 1 wherein, during the growth step, the temperature is substantially constant and substantially the same for both the source and the substrate.

5. The method of claim 1 wherein, during the growth step, the substrate is hotter than the source for at least 5 minutes.

6. The method of claim 1 wherein, during the interdiffusion step, the temperature is substantially constant and substantially the same for the source and for the substrate, if any.

* * * * *